(12) United States Patent
Kang et al.

(10) Patent No.: US 8,664,659 B2
(45) Date of Patent: Mar. 4, 2014

(54) ORGANIC LIGHT-EMITTING DIODE DISPLAY APPARATUS AND METHOD OF MANUFACTURING THE SAME

(75) Inventors: Jin-Goo Kang, Yongin (KR); Mu-Hyun Kim, Yongin (KR); Jae-Bok Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 421 days.

(21) Appl. No.: 12/985,935

(22) Filed: Jan. 6, 2011

(65) Prior Publication Data
US 2011/0175095 A1 Jul. 21, 2011

(30) Foreign Application Priority Data
Jan. 21, 2010 (KR) .................. 10-2010-0005745

(51) Int. Cl.
*H01L 51/52* (2006.01)
*H01L 51/56* (2006.01)

(52) U.S. Cl.
USPC .......... 257/59; 257/40; 257/72; 257/E27.111; 257/E29.278; 257/E51.018; 257/E51.022; 313/112; 313/504; 313/506; 313/511; 313/512

(58) Field of Classification Search
USPC ........... 257/40, 59, 72, E27.111, E29.278, 257/E51.018, E51.022; 313/112, 504, 506, 313/511, 512
See application file for complete search history.

(56) References Cited

U.S. PATENT DOCUMENTS

| | | | |
|---|---|---|---|
| 2003/0146695 A1* | 8/2003 | Seki | 313/506 |
| 2005/0110020 A1* | 5/2005 | Hayashi et al. | 257/72 |
| 2005/0179377 A1 | 8/2005 | Shitagami et al. | |
| 2007/0257253 A1 | 11/2007 | Im et al. | |
| 2008/0012472 A1 | 1/2008 | Uchida | |
| 2009/0273279 A1 | 11/2009 | Chino et al. | |

FOREIGN PATENT DOCUMENTS

| | | |
|---|---|---|
| KR | 1020050030296 A | 3/2005 |
| KR | 10-2007-0079303 A | 8/2007 |
| KR | 10-2007-0096702 A | 10/2007 |
| KR | 10-2008-0014328 A | 2/2008 |

OTHER PUBLICATIONS

Extended European Search Report issued by the European Patent Office dated Oct. 26, 2011, 7 pages.

* cited by examiner

*Primary Examiner* — Matthew W Such
*Assistant Examiner* — David Spalla
(74) *Attorney, Agent, or Firm* — Knobbe Martens Olson & Bear, LLP

(57) ABSTRACT

Provided are an organic light-emitting diode (OLED) display apparatus and a method of manufacturing the OLED display apparatus. Pixel-defining layers (PDLs) are formed of inorganic and organic insulating layers to minimize non-uniformities of the thicknesses of organic emission layers (OEMLs) and planarize lower thin film transistors (TFTs). Therefore, a lifespan of the OLED display apparatus is improved.

18 Claims, 6 Drawing Sheets

ORGANIC LIGHT-EMITTING DIODE DISPLAY APPARATUS AND METHOD OF MANUFACTURING THE SAME

CROSS-REFERENCE TO RELATED APPLICATIONS

This application claims the benefit of Korean Patent Application No. 10-2010-0005745, filed on Jan. 21, 2010, in the Korean Intellectual Property Office, the disclosure of which is incorporated herein in its entirety by reference.

BACKGROUND OF THE INVENTION

1. Field of the Invention

The present embodiments relate to an organic light-emitting diode (OLED) display apparatus and a method of manufacturing the same, and more particularly, to an OLED display apparatus including pixels having uniform thicknesses and a method of manufacturing the same.

2. Description of the Related Art

An organic light-emitting diode (OLED) display apparatus is classified as passive matrix (PM) and active matrix (AM) type OLED display apparatuses according to its driving method. In the PM type OLED (PM-OLED) display apparatus, anodes and cathodes are arrayed in a plurality of columns and a plurality of rows. Thus, the cathodes are supplied with scanning signals from a row driving circuit. Here, only one of the plurality of rows is selected. Also, a data signal is input into each pixel from a column driving circuit. The AM type OLED (AM-OLED) display apparatus controls a signal input into each pixel using a thin film transistor (TFT) and is appropriate for processing a large number of signals. Thus, the AM-OLED display apparatus is mainly used as a display apparatus for realizing a moving picture.

A passivation layer is formed on the TFT of the AM-OLED display apparatus to passivate the TFT and as a planarizing layer for planarizing an upper surface of the TFT. Pixel-defining layers (PDLs) are formed on the passivation layer.

If the PDLs are formed thick to prevent color mixtures among pixels, the thicknesses of emission parts formed among the PDLs vary. If thin PDLs are formed to solve these color mixtures, an upper surface of TFT area underneath the thin PDLs is not planarized. The present embodiments overcome the above problems as well as provide additional advantages.

SUMMARY OF THE INVENTION

The present embodiments provide an organic light-emitting diode (OLED) display apparatus in which a thickness of an emission area is uniform and an upper surface of thin film transistor (TFT) area is planarized and a method of manufacturing the OLED display apparatus According to an aspect of the present embodiments, there is provided an organic light-emitting diode (OLED) display apparatus including: thin film transistor (TFT) which is formed on a substrate; first electrode which is formed on a planarizing layer in each pixel, wherein the planarizing layer covers the TFT; pixel-defining layers (PDLs) which includes first PDL covering an end of the first electrode and second PDL exposing an end of the first PDL and covering the first PDL; intermediate layer which is formed on the first electrode and includes an emission layer (EML); and second electrode which is positioned opposite to the first electrode.

According to another aspect of the present embodiments, there is provided a method of manufacturing an organic light-emitting diode (OLED) display apparatus, including: forming over a substrate first electrodes in each pixel; forming first PDLs covering ends of the first electrodes; forming second PDLs exposing ends of the first PDLs and covering the first PDLs; and forming intermediate layers including EMLs on the first electrodes; and forming second electrodes opposite to the first electrodes.

The second PDL may be formed on the first PDL to bury uneven parts formed on a planarizing layer.

The first PDLs may be formed of inorganic layers. The first PDLs may be formed of at least one of $SiO_2$, $SiNx$, $Al_2O_3$, $CuOx$, $Tb_4O_7$, $Y_2O_3$, $Nb_2O_5$, and $Pr_2O_3$ for example.

Each of the first PDLs may be formed to a thickness of from about 0.1 μm to about 1 μm.

The second PDLs may include organic layers. The second PDLs may be formed of one selected from the group consisting of polyacryl, polyimide, polyimide (PA), benzocyclobutene (BCB), and phenolic resin.

Each of the second PDLs may have a thickness from about 0.1 μm to about 2 μm in a direction in which different color pixels are arrayed, and a thickness between 0.1 μm and 1 μm in a direction in which equal color pixels are arrayed.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Figure 1:
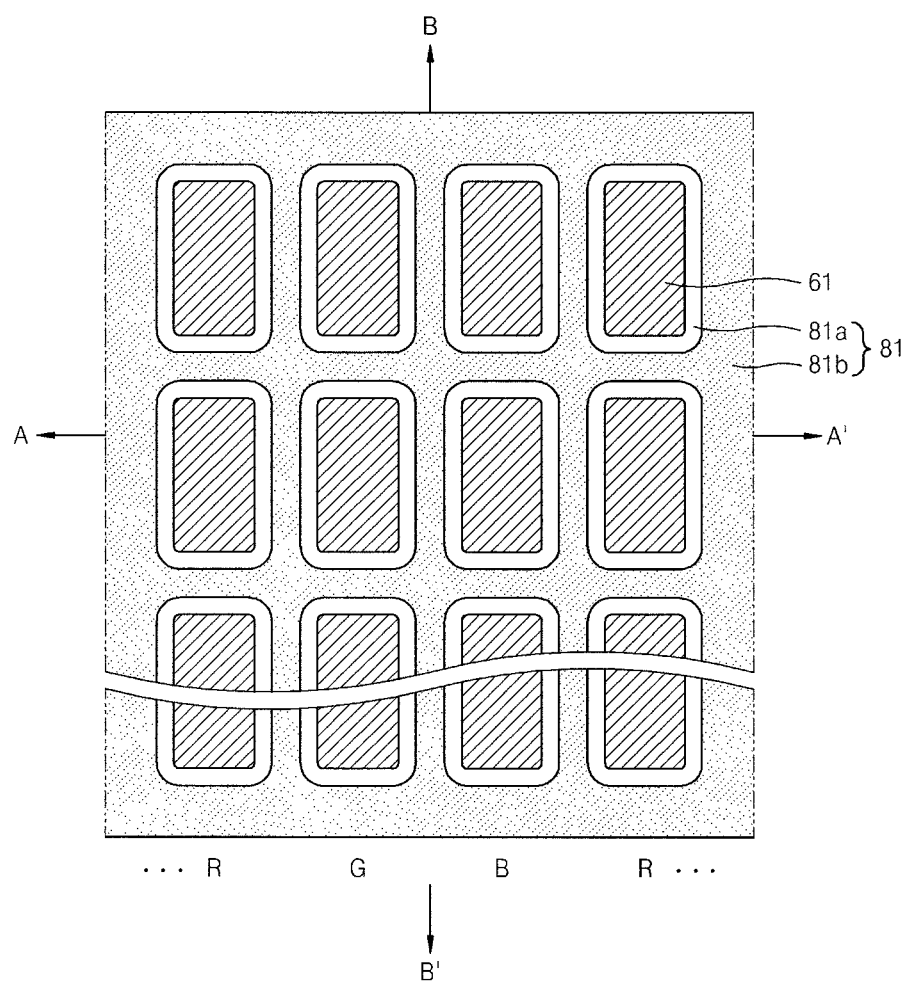
FIG. 1 is a schematic plan view of a pixel electrode part of an organic light-emitting diode (OLED) display apparatus according to an embodiment.

Exemplary embodiments will now be described with reference to the accompanying drawings. In the drawings, like reference numerals denote like elements. These embodiments may, however, be embodied in many different forms and should not be construed as limited to the embodiments set forth herein. Rather, these embodiments are provided so that this disclosure is thorough, and will fully convey the scope of the embodiments to those skilled in the art.

In the drawings, the size and relative sizes of layers and regions may be exaggerated for clarity. It will be understood that, unless otherwise specified, when an element such as a layer, film, region or substrate is referred to as being "on" another element, it can be directly on the other element or intervening elements may also be present.

Figure 2:
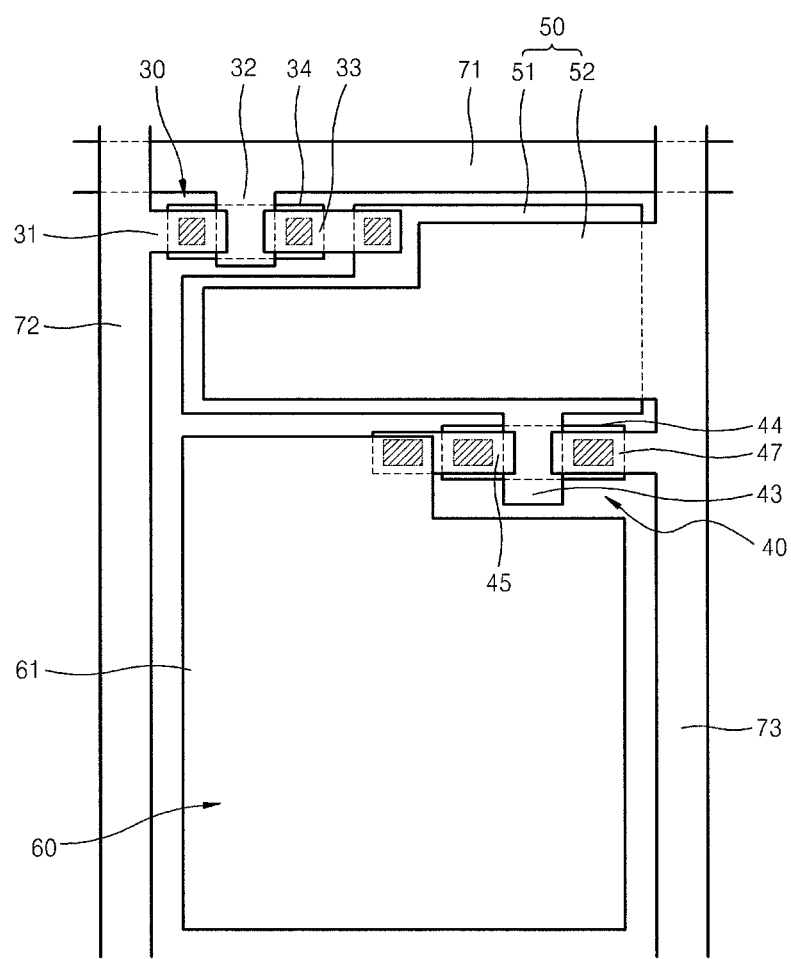
FIG. 2 is an enlarged plan view of a pixel of OLED display apparatus of FIG. 1.

FIG. 1 is a schematic plan view of a pixel electrode part of an organic light-emitting diode (OLED) display apparatus according to an embodiment. FIG. 2 is an enlarged plan view of a pixel of the OLED display apparatus of FIG. 1.

Referring to FIGS. 1 and 2, the OLED display apparatus includes a display area in which red (R), green (G), and blue (B) pixels are repeatedly arrayed. In the present embodiment, the R, G, and B pixels are repeatedly arrayed in stripe patterns in columns and rows but the present embodiments are not limited thereto. For example, the R, G, and B pixels may be arrayed in zigzag patterns in which pixels in each row are misaligned, matrix patterns, or the like. In the present embodiment, a part of the display area is illustrated for convenience, the R, G, and B pixels are repeatedly arrayed in direction A-A', and the same color pixels are repeatedly arrayed in direction B-B'.

Each of the R, G, and B pixels includes a selective driving circuit, which has thin film transistors (TFTs) 30 and 40, a capacitor 50, and the like, and an OLED 60. Each of the R, G, and B pixels includes a data line 72, a gate line 71, and a power source line 73 that is a driving power source of the OLED 60.

The TFTs 30 and 40 respectively are a switching TFT and a driving TFT (hereinafter the TFTs 30 and 40 will be respectively referred to as the switching TFT 30 and the driving TFT 40). The switching TFT 30 is driven by a scan signal applied to the gate line 71 to transmit a data signal applied to the data line 72. The driving TFT 40 determines an amount of current flowing into the OLED 60 according to the data signal transmitted through the switching TFT 30.e.g., a voltage difference between a gate and a source. The capacitor 50 stores the data signal transmitted through the switching TFT 30 for a frame.

A source electrode 31 of the switching TFT 30 is connected to the selective driving circuit through the data line 72, and a gate electrode 32 of the switching TFT 30 is connected to another driving circuit (not shown) through the gate line 71. A drain electrode 33 of the switching TFT 30 is connected to a first capacitor electrode 51 of the capacitor 50 and a gate electrode 43 of the driving TFT 40.

A second capacitor electrode 52 of the capacitor 50 and a source electrode 47 of the driving TFT 40 are connected to the power source line 73, and a drain electrode 45 of the driving TFT 40 is connected to a first electrode 61 of the OLED 60.

The number of TFTs and capacitors of the selective driving circuit is not limited thereto, and the selective driving circuit may include a larger number of TFTs and a larger number of capacitors.

The OLED 60 includes the first electrode 61, which is a pixel electrode, and a second electrode (not shown) which is a common electrode and opposite to the first electrode at a predetermined gap from the first electrode 61. An intermediate layer (not shown) including an organic emission layer (OEML) intervenes between the first electrode 61 and the second electrode to emit light by the first electrode 61 and the second electrode.

A pixel-defining layer (PDL) 81 is formed around an end of the first electrode 61 of the OLED 60. The PDL 81 includes a first PDL 81a, which is an inorganic layer, and a second PDL 81b, which is an organic layer. The first PDL 81a is formed to cover the end of the first electrode 61, and the second PDL 81b is formed on the first PDL 81a to expose an end of the first PDL 81a.

Figure 3:
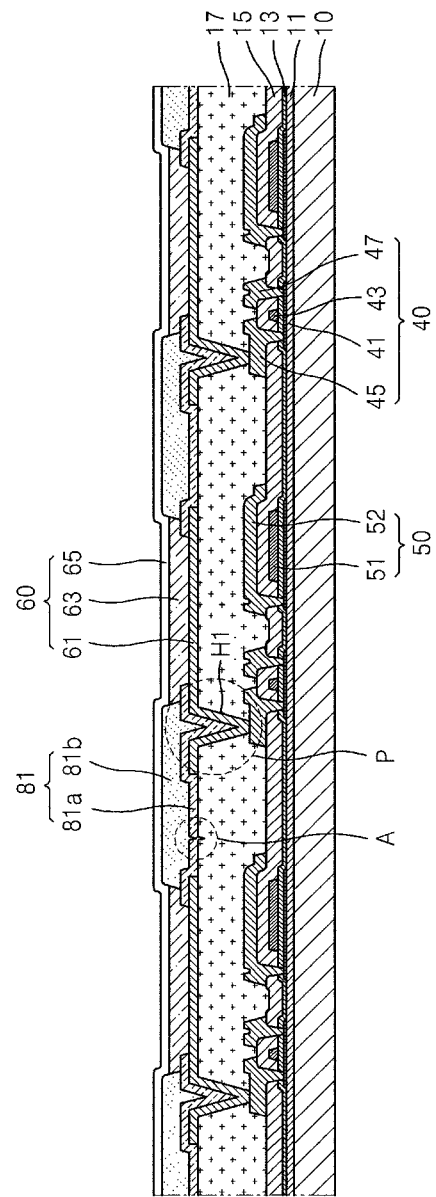
FIG. 3 is a schematic cross-sectional view of an OLED display apparatus according to another embodiment.

FIG. 3 is a schematic cross-sectional view of an OLED display apparatus according to another embodiment.

Referring to FIG. 3, the OLED display apparatus includes a plurality of TFTs 40 and a plurality of OLEDs 60 which are formed on a substrate 10.

Each TFT 40 includes active layer 41, gate electrode 43, and source and drain electrodes 45 and 47. A gate insulating layer 13 intervenes between the gate electrode 43 and the active layer 41 to insulate the gate electrode 43 from the active layer 41. The active layer 41 includes source and drain regions and a channel region. Here, a high-density dopant has been injected into both ends of each of the source and drain regions, and the channel region is formed between the source and drain regions. The source and drain regions are respectively connected to the source/drain electrodes 45 and 47.

Each OLED 60 includes a first electrode 61, a second electrode 65, and an intermediate layer 63 intervening between the first and second electrodes 61 and 65. The first electrode 61 is formed on a passivation layer 17 in each pixel and connected to one of the source/drain electrodes 45 and 47 of the TFTs 40 through via holes H1.

PDLs 81 are formed around ends of the first electrodes 61 to define the pixels. The PDLs 81 include first PDLs 81a and second PDLs 81b. Each of the first PDLs 81a is formed of an inorganic layer. The first PDLs 81a are formed between adjacent two first electrodes 61 and cover the ends of the first electrodes 61. Each of the second PDLs 81b is formed of organic layer on the first PDL 81a to cover steep slope region P in which the end of the first electrode 61 and the via hole H1 is formed. The edge of second PDL 81b is positioned at predetermined distance from edge of the first PDL 81a. Distances between edges of the first and second PDLs 81a and 81b may be about 1 μm or less and may be determined in consideration of aperture ratio and emission effective region of the first electrode 61.

Thicknesses of the first PDLs 81a may be each set to from about 0.1 μm to about 1 μm.

Thicknesses of the second PDL 81b may be each set to from about 0.1 μm to about 2 μm in the direction A-A' of FIG. 1 to prevent color mixtures among adjacent R, G, and B pixels. And thickness of the second PDL 81b may be set to from about 0.1 μm to about 1 μm in the direction B-B' of FIG. 1 to minimize step differences of the OEMLs.

The first PDLs 81a are formed of an inorganic material having similar surface energy to that of the intermediate layers 63 stacked on the first electrodes 61. The second PDLs 81b are formed of an organic material having different surface energy from that of the intermediate layers 63.

PDL is formed, and surface of the PDL is processed using a liquid repellent to prevent color mixtures among pixels in order to form OEML using an ink jet or nozzle printing method. Here, if the PDLs is formed thick, thicknesses of the center of a pixel and the end of the pixel meeting the PDL are different from each other. If the PDL is formed thin, surface curves of lower TFT area formed by uneven parts such as steep slope regions P or cracks A are not sufficiently planarized, wherein a via hole is formed in the steep slope region P, and the cracks A are formed in an etching process. Thus, moisture, oxygen, or the like penetrates into the PDL, and shorts may occur between the first and second electrodes 61 and 65.

Accordingly, in the present embodiment, the first PDLs 81a having thin thicknesses are formed around the end of the first electrode 61, and the second PDL 81b is formed at predetermined distance from the edge of the first PDL 81. Thus, non-uniformities of the thicknesses of the OEMLs are minimized. Also, the second PDLs 81b are formed on the first PDLs 81a in which uneven parts such as cracks or the like are formed, to improve step coverage in order to planarize lower TFT area and minimize short between the first and second electrodes 61 and 65.

In the present embodiment, the second PDLs 81b are formed on the first PDLs 81a, except on the ends of the first PDLs 81a. According to another embodiment, the second PDLs 81b may be additionally formed in the uneven parts such as the steep slope regions P or the cracks A.

Three TFTs and three capacitors are shown in FIG. 3 but the present embodiment is not limited thereto. Thus, at least one TFT and at least one capacitor may be formed.

Figure 4:
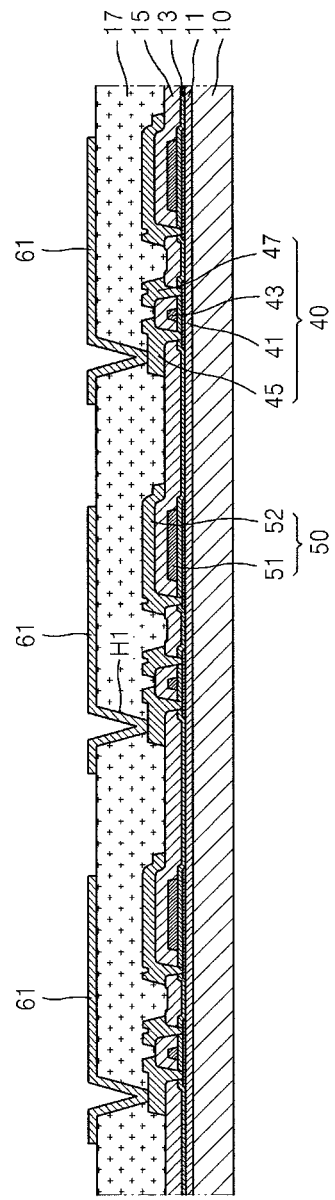
FIGS. 4 through 6 are schematic cross-sectional views illustrating a method of manufacturing an OLED display apparatus, according to an embodiment.
Figure 5:
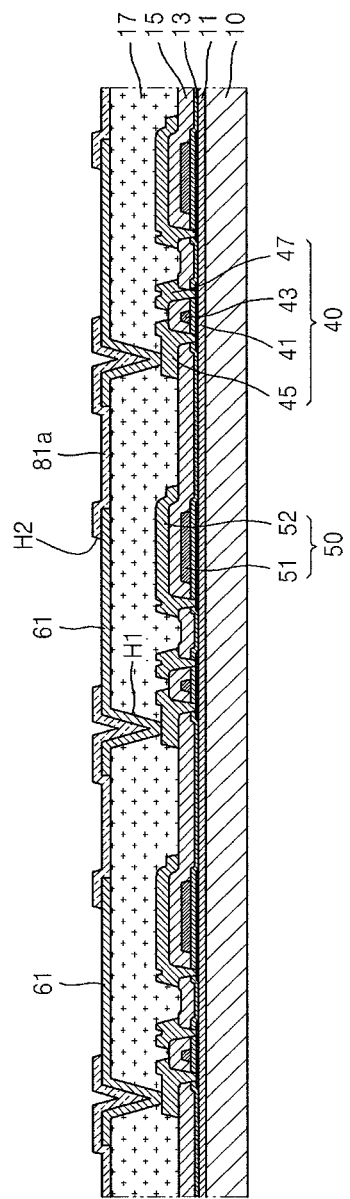
Figure 6:
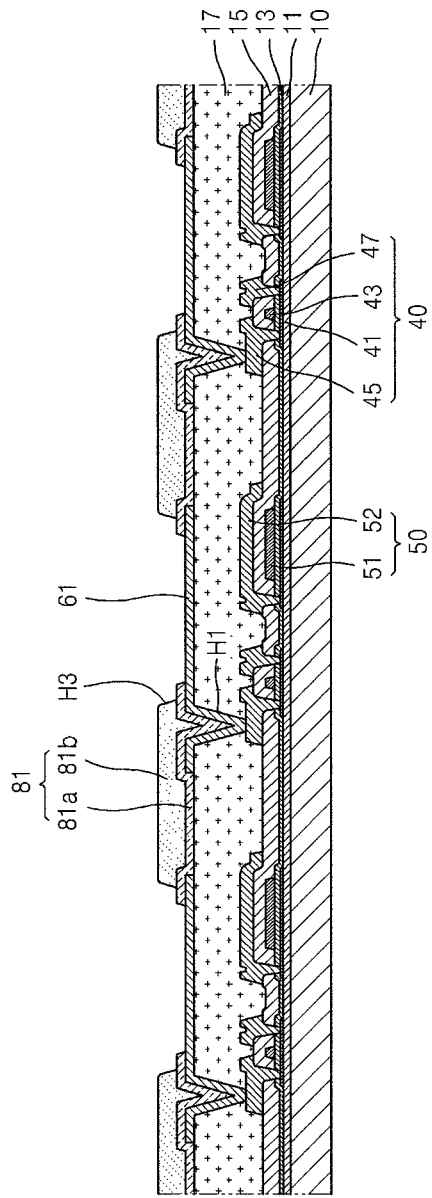

FIGS. 4 through 6 are schematic cross-sectional views illustrating a method of manufacturing an OLED display apparatus, according to an embodiment. The present embodiment exemplifies an OLED display apparatus having a stripe structure in which the same color pixels are arrayed in column directions, and R, G, and B pixels are repeatedly arrayed in row directions from left to right.

Referring to FIG. 4, TFTs 40 and first electrodes 61 are formed above a substrate 10.

The substrate 10 may be formed of a transparent glass material including $SiO_2$ as a main component but is not limited thereto. That is, the substrate 10 may be formed of a transparent plastic material, a metallic material, or the like.

If the OLED display apparatus is a bottom-emission type display apparatus which realizes an image toward the substrate 10, the substrate 10 is formed of a transparent material. If the OLED display apparatus is a top-emission type display apparatus which realizes an image in an opposite direction to the substrate 10, the substrate 10 does not need to be formed of a transparent material. In this case, the substrate 10 may be formed of metal. If the substrate 10 is formed of the metal, the substrate 10 may include at least one or more selected from the group consisting of carbon (C), iron (Fe), chrome (Cr), manganese (Mn), nickel (Ni), titanium (Ti), molybdenum (Mo), stainless steel (SUS), an invar alloy, an inconel alloy, and a kovar alloy. However, the substrate 10 is not limited thereto and may be formed of a metal foil.

An insulating layer 11 is formed on an upper surface of the substrate 10 to prevent diffusion of dopant ions and penetration of moisture or air and function and for planarizing the upper surface of the substrate 10 as a barrier layer and/or a buffer layer. The insulating layer 11 may be formed of $SiO_2$ and/or silicon nitride (SiNx) using a plasma enhanced chemical vapor deposition (PECVD) method, an atmospheric pressure CVD (APCVD) method, a low pressure CVD (LPCVD) method, or the like.

Active layers 41 of the TFTs 40 are formed on the insulating layer 11. In order to form the active layers 41 of the TFTs 40, amorphous silicon may be deposited and crystallized on the insulating layer 11 to form a polycrystalline silicon layer (not shown), and the polycrystalline silicon layer may be patterned.

Each active layer 41 of the TFTs 40 includes source and/or drain regions and channel region. Each active layer 41 has the source and drain regions at ends of the active layer 41 corresponding to sides of gate electrode 43 by doped with N-type or p-type dopants. The channel region is formed between the source and drain regions.

A gate insulating layer 13 is formed on the active layers 41 of the TFTs 40. The gate insulating layer 13 may be formed of an inorganic material such as SiNx or silicon oxide (SiOx) using a PECVD method, an APCVD method, an LPCVD method, or the like.

The gate electrodes 43 are formed partially on the gate insulating layer 13, and an interlayer insulating layer 15 is formed to cover the gate electrodes 43.

The gate electrodes 43 may be formed of various types of conductive materials such as Al, Mo, tungsten (W), Cr, Ni, or a compound of Al, Mo, W, Cr, and Ni. If light is to pass through the active layers 41 of the TFTs 40 and other elements, the gate electrodes 43 may be formed of various types of transparent conductive materials such as ITO, IZO, or the like.

Source/drain electrodes 45 and 47 are formed on the interlayer insulating layer 15 and connected to the active layers 41 through contact holes formed in the interlayer insulating layer 15. A planarizing layer 17 is formed on the source/drain electrodes 45 and 47.

The planarizing layer 17 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like. The organic insulating layer may include commercial polymer such as polymethyl methacrylate (PMMA), polystyrene (PS), or the like, polymeric derivative having a phenol group, acryl-based polymer, imide-based polymer, allylether-based polymer, amide-based polymer, fluorine-based polymer, p-xylene-based polymer, vinyl alcohol-based polymer, or a blend of commercial polymer, polymeric derivative, acryl-based polymer, imide-based polymer, allylether-based polymer, amide-based polymer, fluorine-based polymer, p-xylene-based polymer, and vinyl alcohol-based polymer. The planarizing layer 17 may have a complex stack structure of an inorganic insulating layer and an organic insulating layer.

Stack structures of TFTs as described above are not limited thereto, and TFTs having various types of structures may be used. The present embodiment exemplifies top gate type TFTs, but different types of TFTs may be formed.

The first electrodes 61 are formed on the planarizing layer 17 as pixel electrodes of an OLED and are electrically connected to one of the source/drain electrodes 45 and 47 through via holes H1. The via holes H1 are formed by etching the planarizing layer 17 and exposing the source/drain electrodes 45 and 47.

The first electrodes 61 may be formed of various types of conductive materials in each pixel. If the OLED display apparatus is a bottom-emission type display apparatus which realizes an image toward the substrate 10, the first electrodes 61 may be transparent electrodes and may be formed of ITO, IZO, ZnO, or $In_2O_3$ for example, having a high work function. If the OLED display apparatus is a top-emission type display apparatus which realizes an image in an opposite direction to the substrate 10, the first electrodes 61 may be reflective electrodes. A reflective layer may be formed of Ag, Mg, Al, Pt, Pd, Au, Ni, Nd, Ir, Cr, Li, Ca, or a compound of Ag, Mg, Al, Pt, Pd, Au, Ni, Nd, Ir, Cr, Li, and Ca, and ITO, IZO, ZnO, or $In_2O_3$, for example, having a high work function may be formed on the reflective layer in order to form the first electrodes 61.

Referring to FIG. 5, first PDLs 81a are formed to cover ends of the first electrodes 61.

In order to form the first PDLs 81a, an inorganic insulating layer is deposited on a whole surface of the substrate 10 above which the first electrodes 61 have been formed, and patterned using a photolithographic process, to form openings H2 which expose central parts of the first electrodes 61.

The inorganic insulating layer may be formed of one or more inorganic insulating materials selected from SiO2, SiNx, Al2O3, CuOx, Tb4O7, Y2O3, Nb2O5, Pr2O3, and the like using a sputtering method, a CVD method, a deposition method, or the like.

The first PDLs 81a may be each formed to a thickness between about 0.1 μm and 1 μm to minimize differences in thicknesses of OEMLs between ends and central parts of the first electrodes 61.

Referring to FIG. 6, second PDLs 81b are formed on the first PDLs 81a.

An organic insulating layer is deposited on the whole surface of the substrate 10 above which the first PDLs 81a have been formed, and then patterned using a photolithographic process, to form openings H3 so as to expose central parts of the first electrode 61 and ends of the first PDLs 81a.

The organic insulating layer may be formed of one or more organic insulating materials selected from the group consisting of polyimide, polyamide, acrylic resin, benzocyclobutene (BCB), and phenolic resin using spin coating, slot coating, or the like.

Thicknesses of the second PDLs 81*b* may be each set to a range between about 0.1 µm and 2 µm in row directions to prevent color mixtures among adjacent R, G, and B pixels and a range between about 0.1 µm and 1 µm in column directions to minimize step differences in the thicknesses of the OEMLs.

A gap between edges of the first and second PDLs 81*a* and 81*b* around the end of the first electrode 61 may be about 1 µm.

Cracks may be formed in the first electrodes 61 and the first PDLs 81*a* due to low step coverage between the ends of the first electrodes 61 and peripheral parts of via holes H. Therefore, the second PDLs 81*b* are formed on the first PDLs 81*a* to bury the cracks in order to improve step coverage and prevent penetration of air and shorts between electrodes.

As shown in FIG.3, the intermediate layers 63 including the OEMLs and the second electrodes 65 are formed in openings through which first electrodes 61 are exposed.

The intermediate layers 63 may be formed in a single or complex stack structure of one or more of functional layers including an emissive layer (EML), a hole transport layer (HTL), a hole injection layer (HIL), an electron transport layer (ETL), and an electron injection layer (EIL).

The intermediate layers 63 may be formed of a low or high molecular weight organic material.

If the intermediate layers 63 are formed of the low molecular weight organic material, the HTL and the HIL are stacked toward the first electrodes 61 based on the OEMLs, and the ETL and the EIL are stacked toward the second electrodes 65 in order form the intermediate layers 63. Other types of layers may be stacked in order to form the intermediate layers 63. The low molecular weight organic material may be CuPC, NPB, Alq3, or the like.

If the intermediate layers 63 are formed of the high molecular weight organic material, the intermediate layers 63 may include only the HTL toward the first electrodes 61 with respect to the OEMLs. The HTL may be formed of poly-(2, 4)-ethylene-dihydroxy thiophene (PEDOT), polyaniline (PANI), or the like on the first electrodes 61 using ink jet printing, spin coating, or the like. Here, the high molecular weight organic material may be a PPV-based or polyfluorene-based high molecular weight organic material. Color patterns may be formed using a normal method such as ink jet printing, spin coating, thermal transfer printing using a laser, or the like, in order to form the intermediate layers 63.

The second electrodes 65 may be deposited above the whole surface of the substrate 10 and may be formed as common electrodes. In the OLED display apparatus according to the present embodiment, the first electrodes 61 are used as anode electrodes, and the second electrodes 65 are used as cathode electrodes. However, the present embodiments are not limited thereto and the polarities of the first electrodes 61 and the second electrodes 65 may be the opposite.

If the OLED display apparatus is a bottom-emission type display apparatus which realizes an image toward the substrate 10, the first electrodes 61 are transparent electrodes, and the second electrodes 65 are reflective electrodes. Here, a metal having a low work function, for example, Ag, Mg, Al, Pt, Pd, Au, Ni, Nd, Ir, Cr, Li, Ca, LiF/Ca, LiF/Al, or a compound of Ag, Mg, Al, Pt, Pd, Au, Ni, Nd, Ir, Cr, Li, Ca, LiF/Ca, and LiF/Al, for example, may be thinly deposited to form the reflective electrodes.

Although not shown in the drawings, a sealing member (not shown) and a moisture absorbent may be further formed on the second electrodes 65 to protect the OEMLs from external moisture or oxygen.

As described above, an OLED display apparatus according to the present embodiments includes PDLs formed of inorganic and organic insulating layers. Thus, non-uniformities of the thicknesses of OEMLs are minimized, and lower TFTs are planarized, thereby improving a lifespan of the OLED display apparatus.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting diode (OLED) display apparatus comprising:
    a plurality of thin film transistors (TFT) which are formed on a substrate;
    a plurality of pixels comprising a planarizing layer;
    a first electrode which is formed on the planarizing layer in each pixel, wherein the planarizing layer covers the TFT;
    a plurality of pixel-defining layers (PDLs) which comprise a first PDL covering an end of the first electrode and a second PDL contacting the first PDL, exposing an end of the first PDL and covering the first PDL;
    an intermediate layer formed on the first electrode and comprising an emission layer (EML); and
    a second electrode which is positioned opposite to the first electrode;
    wherein the second PDL has a thickness from about 0.1 µm to about 2 µm in a direction in which different color pixels are arrayed, and a thickness from about 0.1 µm to about 1 µm in a direction in which equal color pixels are arrayed.

2. The OLED display apparatus of claim 1, wherein the second PDL is formed on the first PDL to bury uneven parts of the planarizing layer.

3. The OLED display apparatus of claim 1, wherein the first PDL comprises inorganic layers.

4. The OLED display apparatus of claim 1, wherein the first PDL comprises at least one selected from the group consisting of $SiO_2$, $SiNx$, $Al_2O_3$, $CuOx$, $Tb_4O_7$, $Y_2O_3$, $Nb_2O_5$, and $Pr_2O_3$.

5. The OLED display apparatus of claim 1, wherein the first PDL is formed to a thickness of from about 0.1 µm to about 1 µm.

6. The OLED display apparatus of claim 1, wherein the second PDL comprises organic layers.

7. The OLED display apparatus of claim 1, wherein the second PDL comprises at least one selected from the group consisting of polyacryl, polyimide, polyamide (PA), benzocyclobutene (BCB), and phenolic resin.

8. The OLED display apparatus of claim 1 wherein the planarizing layer comprises at least one of an inorganic insulating layer and an organic insulating layer.

9. The OLED display apparatus of claim 8, wherein the planarizing layer comprises an inorganic layer comprising at least one selected from the group consisting of $SiO_2$, $SiNx$, $SiON$, $Al_2O_3$, $TiO_2$, $Ta_2O_5$, $HfO_2$, $ZrO_2$, BST, and PZT.

10. The OLED display apparatus of claim 1 wherein the planarizing layer comprises an organic layer comprising at least one of polymethyl methacrylate (PMMA), polystyrene (PS), polymeric derivative having a phenol group, acryl-based polymer, imide-based polymer, allylether-based polymer, amide-based polymer, fluorine-based polymer, p-xylene-based polymer, vinyl alcohol-based polymer.

11. The OLED display apparatus of claim 1, wherein the planarizing layer has a complex stack structure of an inorganic insulating layer and an organic insulating layer.

12. A method of manufacturing an organic light-emitting diode (OLED) display apparatus, comprising:
  forming first electrodes over a substrate in each pixel;
  forming first PDLs covering ends of the first electrodes;
  forming second PDLs contacting the first PDLs, exposing ends of the first PDLs and covering the first PDLs; and
  forming intermediate layers comprising EMLs on the first electrodes; and
  forming second electrodes opposite to the first electrodes;
  wherein the second PDL has a thickness from about 0.1 μm to about 2 μm in a direction in which different color pixels are arrayed, and a thickness from about 0.1 μm to about 1 μm in a direction in which equal color pixels are arrayed.

13. The method of claim 12, wherein the second PDL is formed on the first PDL to bury uneven parts on a planarizing layer.

14. The method of claim 12, wherein the first PDLs are formed of inorganic layers.

15. The method of claim 12, wherein the first PDLs are formed of at least one selected from the group consisting of $SiO_2$, $SiNx$, $Al_2O_3$, $CuOx$, $Tb_4O_7$, $Y_2O_3$, $Nb_2O_5$, and $Pr_2O_3$.

16. The method of claim 12, wherein each of the first PDLs is formed to a thickness from 0.1 μm to 1 μm.

17. The method of claim 12, wherein the second PDLs comprise organic layers.

18. The method of claim 12, wherein the second PDLs are formed of at least one selected from the group consisting of polyacryl, polyimide, polyamide (PA), benzocyclobutene (BCB), and phenolic resin.

* * * * *